(12) United States Patent
Kim (10) Patent No.: US 11,942,939 B2
(45) Date of Patent: Mar. 26, 2024

(54) APPARATUS AND METHOD FOR REDUCING TEMPERATURE INFLUENCE IN MEASURING SWITCHING CURRENT

(71) Applicant: HYUNDAI MOBIS CO., LTD., Seoul (KR)

(72) Inventor: Sang Min Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 17/491,407

(22) Filed: Sep. 30, 2021

(65) Prior Publication Data
US 2022/0286115 A1    Sep. 8, 2022

(30) Foreign Application Priority Data

Mar. 4, 2021  (KR) .................. 10-2021-0029076

(51) Int. Cl.
*H03K 3/011* (2006.01)
*H03F 3/45* (2006.01)
*H03H 7/06* (2006.01)

(52) U.S. Cl.
CPC .............. *H03K 3/011* (2013.01); *H03H 7/06* (2013.01); *H03F 3/45475* (2013.01)

(58) Field of Classification Search
CPC .................................................. H03K 3/011
See application file for complete search history.

(56) References Cited

U.S. PATENT DOCUMENTS

| | | | | |
|---|---|---|---|---|
| 5,359,434 A * | 10/1994 | Nakao | ................ | G06K 15/1219 347/132 |
| 8,085,024 B2 * | 12/2011 | Prodic | .................. | H02M 3/157 323/283 |
| 8,947,101 B2 * | 2/2015 | Engl | ...................... | G01R 27/14 324/202 |
| 9,438,261 B2 * | 9/2016 | Gonzalez | ............. | H03M 3/382 |
| 10,033,282 B2 | 7/2018 | Babazadeh | | |
| 2008/0203997 A1 * | 8/2008 | Foran | .................. | H02M 3/1588 324/76.11 |
| 2017/0194853 A1 * | 7/2017 | Kim | ........................ | H02M 1/42 |

(Continued)

FOREIGN PATENT DOCUMENTS

| | | | | | |
|---|---|---|---|---|---|
| CN | 105892513 B | * | 9/2019 | ............. | G05D 15/01 |
| JP | 2004357281 A | * | 12/2004 | .......... | H03F 3/2175 |
| JP | 2006-271098 A | | 10/2006 | | |

(Continued)

*Primary Examiner* — Metasebia T Retebo
*Assistant Examiner* — James G Yeaman
(74) *Attorney, Agent, or Firm* — NSIP Law (57) ABSTRACT

An apparatus for reducing a temperature influence in measuring a switching current based on stray inductance. The apparatus includes a current detector configured to output a voltage derived from a differential component of a current so as to detect a switching current of a power module, a filter configured to filter the voltage output from the current detector, an integrator configured to integrate a voltage output from the filter, an ADC configured to convert an analog voltage output from the integrator into a digital voltage and sample the digital voltage, a scaler configured to convert a sampled integrator output value output from the ADC into a scaled current value, and a compensator configured to remove a temperature dependent DCR effect from the scaled current value.

14 Claims, 10 Drawing Sheets

(56) References Cited

U.S. PATENT DOCUMENTS

2018/0299293 A1* 10/2018 Ell ..................... G01C 25/00

FOREIGN PATENT DOCUMENTS

| | | | |
|---|---|---|---|
| JP | 2007-187667 A | | 7/2007 |
| JP | 2011242619 A | * | 12/2011 |
| JP | 2017-122631 A | | 7/2017 |
| JP | 6634270 B2 | | 1/2020 |
| KR | 10-2018-0009242 A | | 1/2018 |
| KR | 10-1875555 B1 | | 7/2018 |
| KR | 10-2114298 B1 | | 5/2020 |
| TW | 201633658 A | * | 9/2016 |
| TW | 201633658 A | * | 9/2016 |
| WO | WO-2011021303 A1 | * | 2/2011 ............. H01J 31/28 |

* cited by examiner

— : Ia_sw: Switching Current
—·—·— : Vintg*(K_scale): Output of Integrator (multiplied by $K_{scale}$)

APPARATUS AND METHOD FOR REDUCING TEMPERATURE INFLUENCE IN MEASURING SWITCHING CURRENT

CROSS-REFERENCE TO RELATED APPLICATION

This application claims priority to and the benefit of Korean Patent Application No. 10-2021-0029076, filed on Mar. 4, 2021, the disclosure of which is incorporated herein by reference in its entirety.

BACKGROUND

1. Field of the Invention

The present invention relates to a technology for measuring a switching current in a power semiconductor power module, and more specifically, to a technology for reducing a temperature influence in measuring a switching current using stray inductance.

2. Discussion of Related Art

Figure 1:
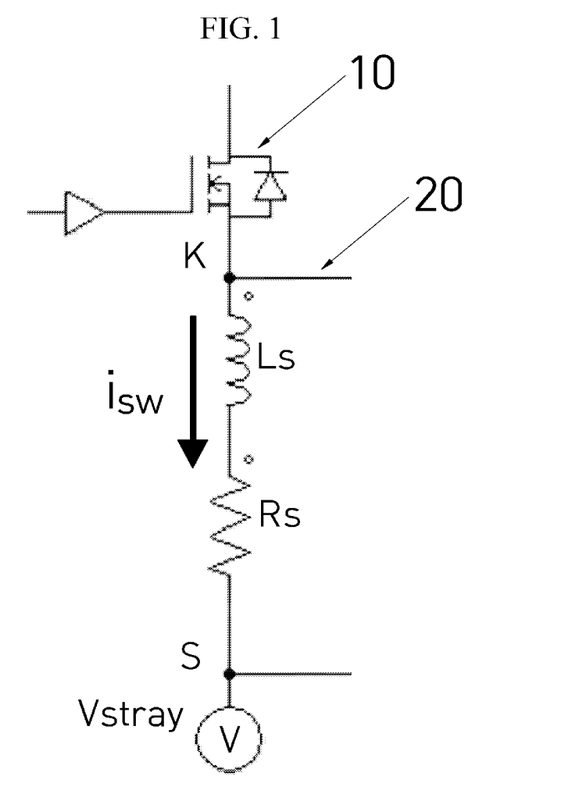
FIG. 1 is an exemplary diagram of a current detector (20) for measuring a switching current for each phase of a power module (power semiconductor) (10)

Referring to FIG. 1, in order to measure a switching current for each phase of a power module (e.g., power semiconductor) 10 in a three-phase inverter, etc., a method is used in which a current detector 20 is connected between a Kelvin pin K and a source pin S of the power module of each phase, and a differential component of a switching current $i_{sw}$ flowing between the Kelvin pin K and the source pin S is integrated to derive a voltage $$L_s \frac{di_{sw}}{dt}$$

and measure a switching current $i_{sw}$ (wherein $L_s$ refers to stray inductance). The method has an advantage in that there is no loss due to measurement as compared with a measuring method using a shunt resistor.

However, in such a method of measuring a switching current, there is a problem in that stray resistance $R_s$ (or a dc resistance (DCR) component) is present in addition to the stray inductance $L_s$ between the Kelvin pin K and the source pin S as shown in FIG. 1. Therefore, a voltage $v_{di/dt}$ output from the current detector 20 is actually $$L_s \frac{di_{sw}}{dt} + R_s i_{sw}.$$

Therefore, a voltage drop component $R_s \times i_{sw}$ due to the stray resistance should be removed. Moreover, a component of the stray resistance $R_s$ is increased or decreased according to a temperature to have temperature dependency. Therefore, in the conventional method of measuring a switching current by measuring a voltage between a Kelvin pin and a source pin, measurement accuracy is lowered.

SUMMARY OF THE INVENTION

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an apparatus includes: current detector configured to output a voltage derived from a differential component of a current so as to detect a switching current of a power module, a filter configured to filter the voltage output from the current detector, an integrator configured to integrate a voltage output from the filter, an analog-to-digital converter (ADC) configured to convert an analog voltage output from the integrator into a digital voltage and to sample the digital voltage, a scaler configured to convert a sampled integrator output value output from the ADC into a scaled current value, and a compensator configured to remove a temperature dependent dc resistance (DCR) effect from the scaled current value.

The filter may be a high pass filter (HPF).

The filter may be a low pass filter (LPF).

The integrator may include an operational amplifier (OP AMP) and may be configured to operate by receiving a pulse width modulation (PWM) switching signal from a controller.

The apparatus may include a reset circuit configured to perform resetting such that an integral value is not accumulated when the integrator performs an integration operation.

During a PWM-ON sequence, the integrator may perform the integration operation, and during a PWM-OFF sequence, the reset circuit may perform a reset operation.

The reset circuit may be configured to perform a reset operation through at least one switch opened and closed in response to a pulse width modulation (PWM) switching signal.

The compensator may be configured to perform a compensation process on a current sampled by the ADC using a software algorithm to output a current from which a stray resistance component is removed.

The compensator may include a software algorithm using parameters for compensating for a current variation flowing in stray inductance and stray resistance, a filtered current variation of an Rs error component and an inverter resistor-inductor (RL) circuit, and the Rs error component to remove a stray resistance component from the switching current.

In another general aspect, a method includes filtering a voltage output from a current detector configured to output a voltage derived from a differential component of a current so as to detect a switching current of a power module, integrating the filtered voltage, converting an integrated analog voltage into a digital voltage to sample the digital voltage, converting a sampled integrator output value into a scaled current value, and compensating for a current by removing a temperature dependent DCR effect from the scaled current value.

The filtering may be high-pass filtering or low-pass filtering.

The integrating may be performed using an operational amplifier (OP AMP), which is configured to operate by receiving a received pulse width modulation (PWM) switching signal.

The method may include performing resetting such that an integral value is not accumulated when an integration operation is performed.

During a PWM-ON sequence, the integration operation may be performed, and during a PWM-OFF sequence, the resetting may be performed.

In the resetting, a reset operation may be performed by at least one switch opened and closed in response to a pulse width modulation (PWM) switching signal.

The compensating may include performing a compensation process on a sampled current using a software algorithm to output a current from which a stray resistance component is removed.

The compensating may be performed by a software algorithm using parameters for compensating for a current variation flowing in stray inductance and stray resistance, a filtered current variation of an Rs error component and a current variation of an inverter resistor-inductor (RL) circuit, and the Rs error component to remove a stray resistance component from the switching current.

Other features and aspects will be apparent from the following detailed description, the drawings, and the claims.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIGS. 3A and 3B are exemplary circuit diagrams of a current detector (20), a filter (30), and an integrator (40) of FIG. 2.

FIGS. 4 to 7 are for describing an integrator (40)

DETAILED DESCRIPTION OF EXEMPLARY EMBODIMENTS

The advantages and features of the present invention and methods for accomplishing the same will be more clearly understood from embodiments to be described in detail below with reference to the accompanying drawing. However, the present invention is not limited to the following embodiments but may be implemented in various different forms. Rather, these embodiments are provided only to complete the disclosure of the present invention and to allow those skilled in the art to understand the category of the present invention. The present invention is defined by the category of the claims. Meanwhile, terms used in this specification are to describe the embodiments and are not intended to limit the present invention. As used herein, singular expressions, unless defined otherwise in context, include plural expressions. It will be further understood that the terms "comprises," "comprising," "includes," and/or "including," when used herein, specify the presence of stated elements, steps, operations, and/or components but do not preclude the presence or addition of one or more other elements, steps, operations, and/or components.

Figure 2:
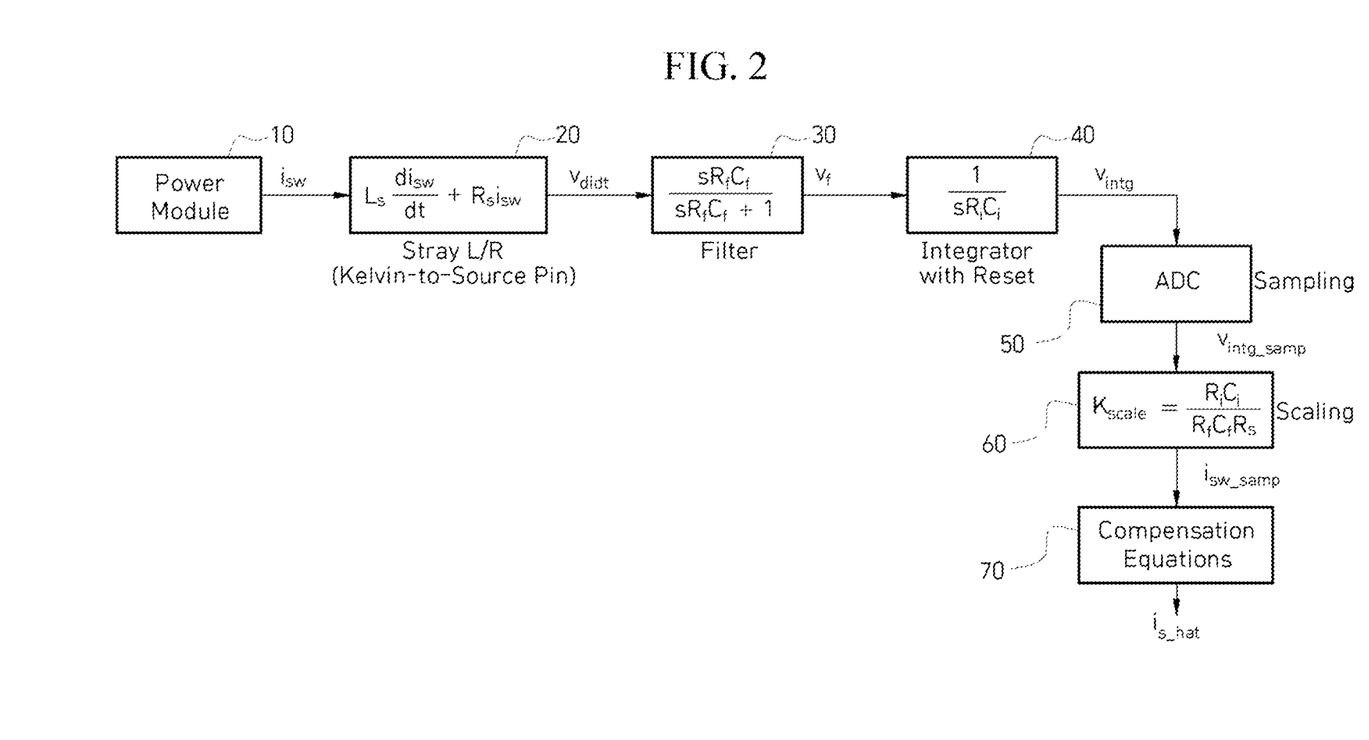
FIG. 2 is a block diagram of an apparatus for reducing a temperature influence in measuring a switching current based on stray inductance according to the present invention.

FIG. 2 is a block diagram of an apparatus for reducing a temperature influence in measuring a switching current based on stray inductance according to the present invention.

As described in FIG. 1, a current detector 20 detects a switching current $i_{sw}$ flowing between a Kelvin pin and a source pin, having therebetween stray inductance $L_s$ and stray resistance $R_s$, through which the switching current $i_{sw}$ of a power module 10 flows. the current detector 20 outputs the voltage $v_{didt}$ derived from a differential component of the current $i_{sw}$.

The apparatus of the present invention includes: a filter 30 which filters a voltage $v_{didt}$ by being connected in parallel to the current detector 20; an integrator 40 which integrates a voltage of output from the filter 30; an analog-to-digital converter (ADC) 50 which converts an analog voltage $v_{intg}$ output from the integrator 40 into a digital voltage, and performs sampling of the converted digital voltage; a scaler 60 which converts a sampled integrator output value $v_{intg\_samp}$ output from the ADC 50 into a current value $i_{sw\_samp}$; and a compensator 70 which removes a temperature dependent dc resistance (DCR) effect from the scaled current $i_{sw\_samp}$.

Each component of FIG. 2 will be described in detail.

Figure 3A:
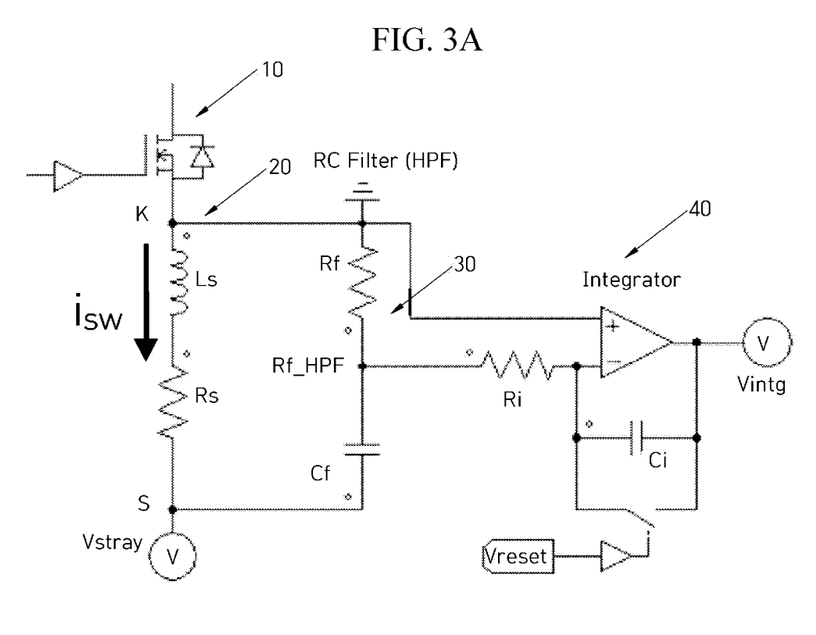
FIG. 3A illustrates an embodiment in which a high pass filter (HPF) is used as a filter.
Figure 3B:
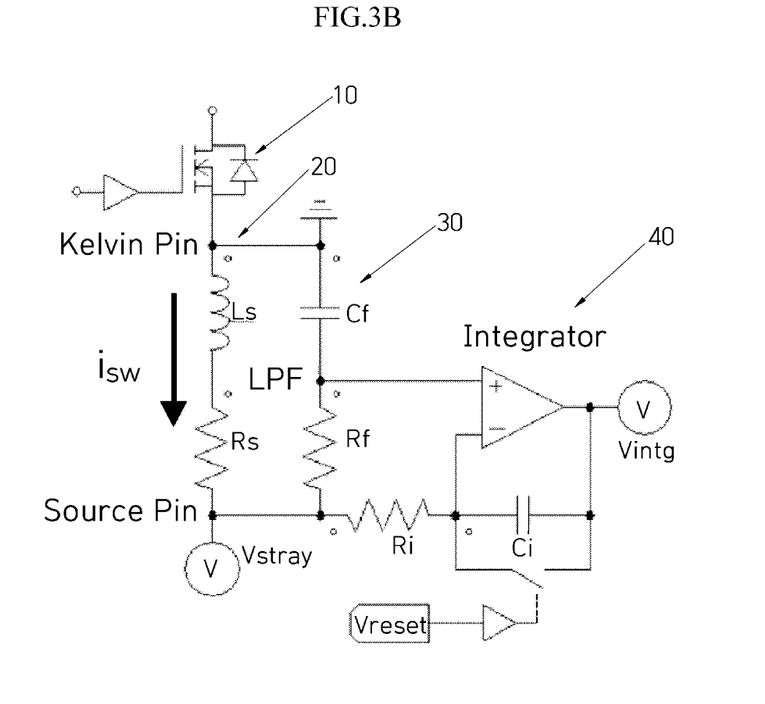
FIG. 3B illustrates an embodiment in which a low pass filter (LPF) is used as a filter.

FIGS. 3A and 3B are exemplary circuit diagrams of the current detector 20, the filter 30, and the integrator 40 of FIG. 2. Specifically, FIG. 3A illustrates an embodiment in which a high pass filter (HPF) is used as the filter 30, and FIG. 3B illustrates an embodiment in which a low pass filter (LPF) is used as the filter 30.

In FIG. 3A, a Kelvin-to-source voltage V_KS derived from the switching current $i_{sw}$ flowing in the power module 10 is $$V_{didt} = L_s \frac{di_{sw}}{dt} + R_s i_{sw}.$$

The Kelvin-to-source voltage V_KS(=$v_{didt}$) is indicated by $V_{stray}$ in FIGS. 3A and 3B. The $V_{stray}$ passes through the filter 30 and is input to the integrator 40. The filter 30 may be implemented as a resistor-capacitor (RC) filter as shown in the drawing and may be implemented as the HPF of FIG. 3A or the LPF of FIG. 3B. Filter parameters of the filter 30 may be set to $R_f*C_f=L_s/R_s$. ($R_f$ and $C_f$ will be described later)

The integrator 40 may be implemented using an OP AMP. The integrator 40 operates by receiving a PWM switching signal from a controller (for example, a microcomputer). An integrator output $v_{intg}$ and the switching current $i_{sw}$ have a relationship of $$v_{intg} = \left(\frac{1}{sR_iC_i}\right) \cdot \frac{sR_fC_fR_s \cdot \left(s\frac{L_s}{R_s}+1\right)}{sR_fC_f+1} i_{sw}.$$

(wherein s denotes a constant, and $R_i$ and $C_i$ will be described later)

Meanwhile, a reset circuit may be required to perform resetting for every switching period such that an integral value should not be accumulated when the integrator performs an integration operation. The reset circuit may be included in the integrator 40. Alternatively, the reset circuit may not be included in the integrator 40 and may be provided as a separate circuit. The integrator 40 and the reset circuit will be described in detail later.

Returning to FIG. 2, the scaler 60 applies a scaling constant $$K_{scale} = \frac{R_i C_i}{R_f C_f R_s}$$

to $V_{intg\_samp}$ provided from the ADC 50 to output a sampled switching current $i_{sw\_samp}$.

The compensator 70 performs a compensation process on the sampled switching current $i_{sw\_samp}$ using a software algorithm, and thereby outputs a current $i_{s\_hat}$ from which a temperature dependent DCR (stray resistance) component is removed.

An integrator 40 will be described in detail with reference to FIGS. 4 to 7.

Figure 4:
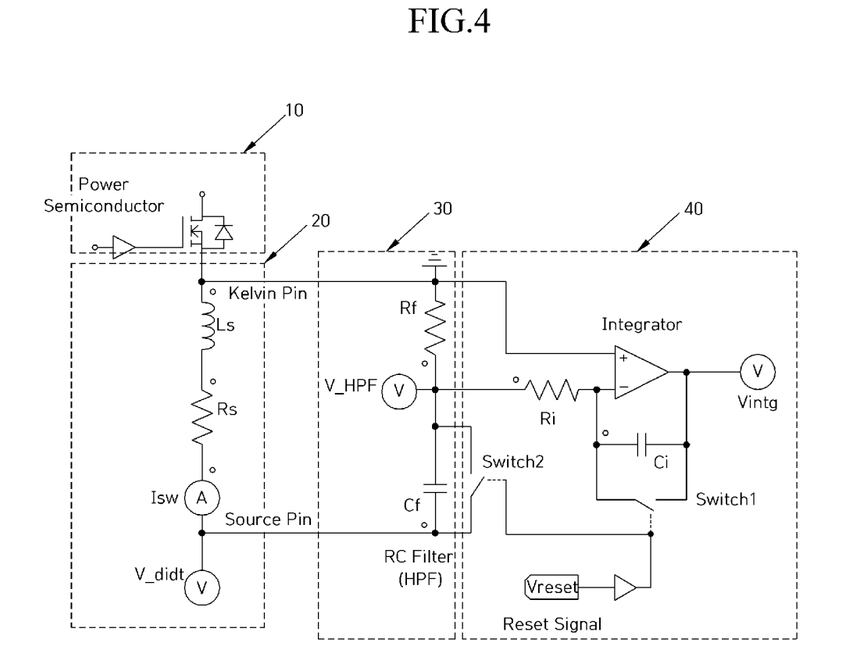
FIG. 4 illustrates an embodiment when a filter (30) is provided as an HPF, FIGS. 5A-5Cc are waveform diagrams for describing operations of an integration mode and a reset mode.

FIG. 4 illustrates an embodiment when a filter 30 is provided as an HPF. The HPF is an RC filter based HPF in which a filter capacitor $C_f$ is connected to a source pin of a current detector 20 and a filter resistor $R_f$ is connected to a Kelvin pin of the current detector 20, and the filter capacitor $C_f$ and the filter resistor $R_f$ are connected in series. An output voltage V_HPF of the filter 30 is applied to a negative input terminal of an integrator OP AMP through an integrator resistor $R_i$. A positive input terminal of the OP AMP is connected to the Kelvin pin and is grounded. An integrating capacitor $C_i$ is connected between the negative input terminal and an output terminal of the OP AMP.

A reset circuit has been described above. The reset circuit is illustrated in FIG. 4. The reset circuit is formed such that a switch 1 configured to connect both ends the integrating capacitor $C_i$ interworks with a switch 2 configured to connect both ends the filter capacitor $C_f$. The switch 1 and the switch 2 operate in response to a PWM switching signal S (=1 or =0) applied to a switching device(s) of a power module 10. As an example, a separate circuit may be provided to generate a reset signal $V_{reset}$ (see FIG. 4) for opening or short-circuiting the switch 1 and the switch 2 when the PWM switching signal is 1 or 0.

That is to say, during a switching device's PWM-ON sequence in which the PWM switching signal S=1 is applied to the switching device, the reset signal $V_{reset}$=0 opens both the switch 1 and the switch 2, and thus, the OP AMP operates as an integrator to measure a current. On the other hand, during a switching device's PWM-OFF sequence in which the PWM switching signal S=0 is applied to the switching device, the reset signal $V_{reset}$=1 short-circuits both the switch 1 and the switch 2, and thus, energy (voltage) having been charged in the integrating capacitor $C_i$ and the filter capacitor $C_f$ is discharged to reset the OP AMP.

Figure 5A:
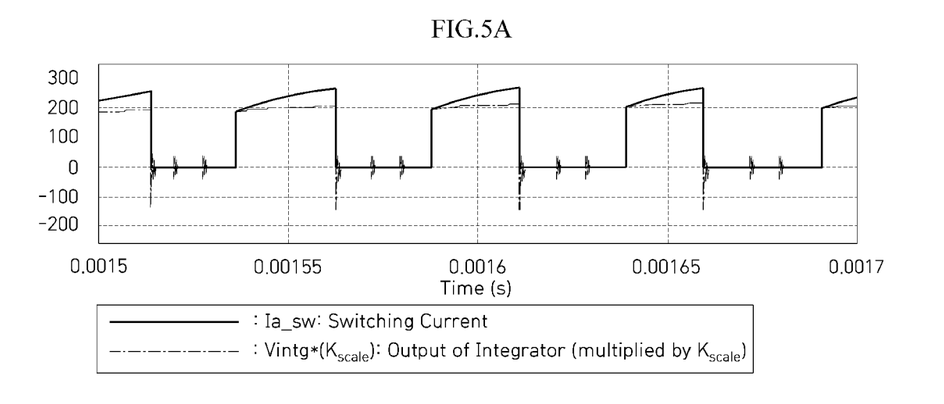
Figure 5B:
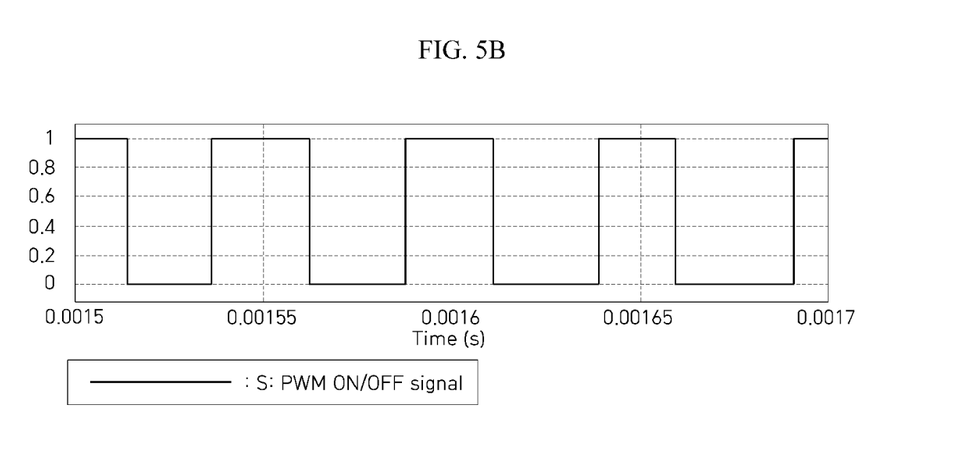
Figure 5C:
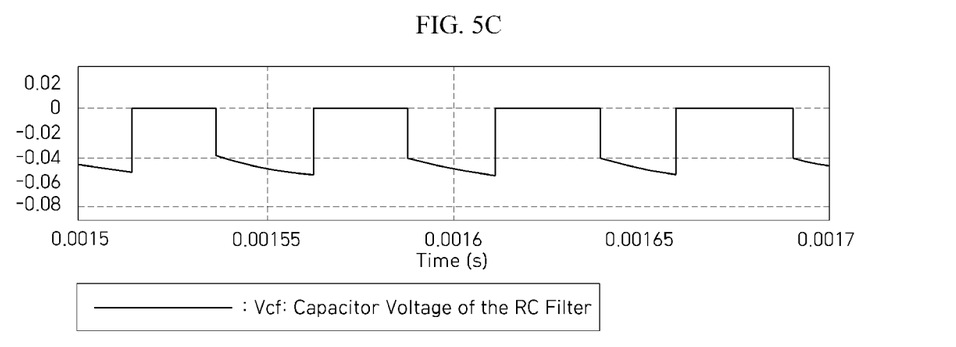

FIGS. 5A-5C show waveforms of an A-phase switching current Ia_sw, an output voltage of an integrator (Vintg*$K_{scale}$), PWM ON/OFF signal S, and a capacitor voltage Vcf of an RC filter 30, for describing operations of the integration mode and the reset mode.

Figure 6:
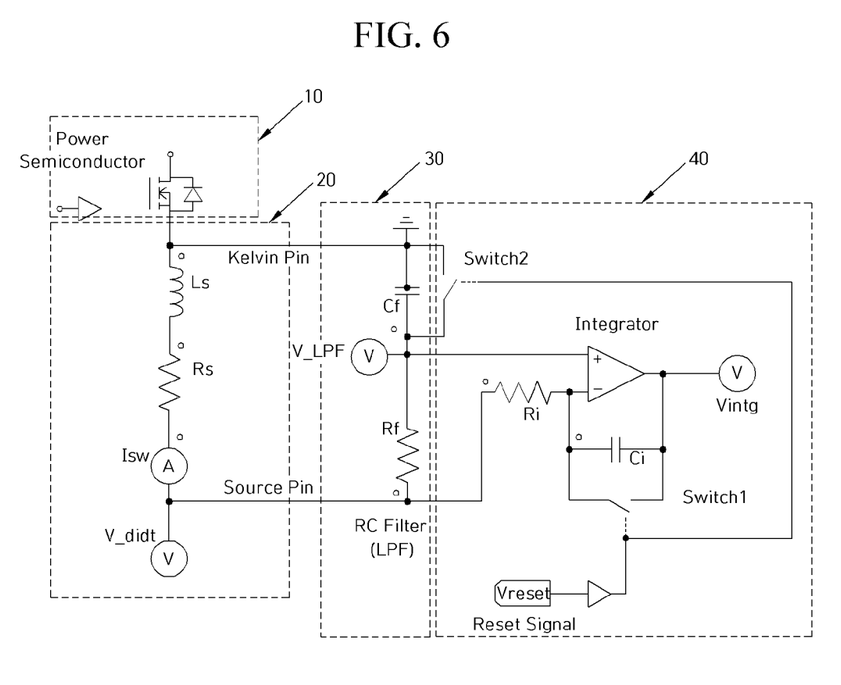
FIG. 6 illustrates an embodiment when a filter 30' is provided as an LPF.

FIG. 6 illustrates an embodiment when a filter 30' is provided as an LPF. Unlike that shown in FIG. 4, the LPF is an RC filter based LPF in which a filter resistor $R_f$ is connected to a source pin of a current detector 20, a filter capacitor $C_f$ is connected to a Kelvin pin of the current detector 20, and the filter resistor $R_f$ and the filter capacitor $C_f$ are connected together. An output voltage V_LPF of the filter 30' is applied to a positive input terminal of an integrator, i.e., OP AMP. A negative input terminal of the OP AMP is connected to the source pin through an integrator resistor $R_i$. An integrating capacitor $C_i$ is connected between the negative input terminal and an output terminal of the OP AMP. In addition, similar to the case of FIG. 4, a reset circuit is formed such that a switch 1 configured to connect both ends the integrating capacitor $C_i$ interworks with a switch 2 configured to connect both ends of the filter capacitor $C_f$. As described above, the switch 1 and the switch 2 operate in response to a PWM switching signal S (=1 or 0). A reset operation is the same as that of FIG. 4.

Figure 7:
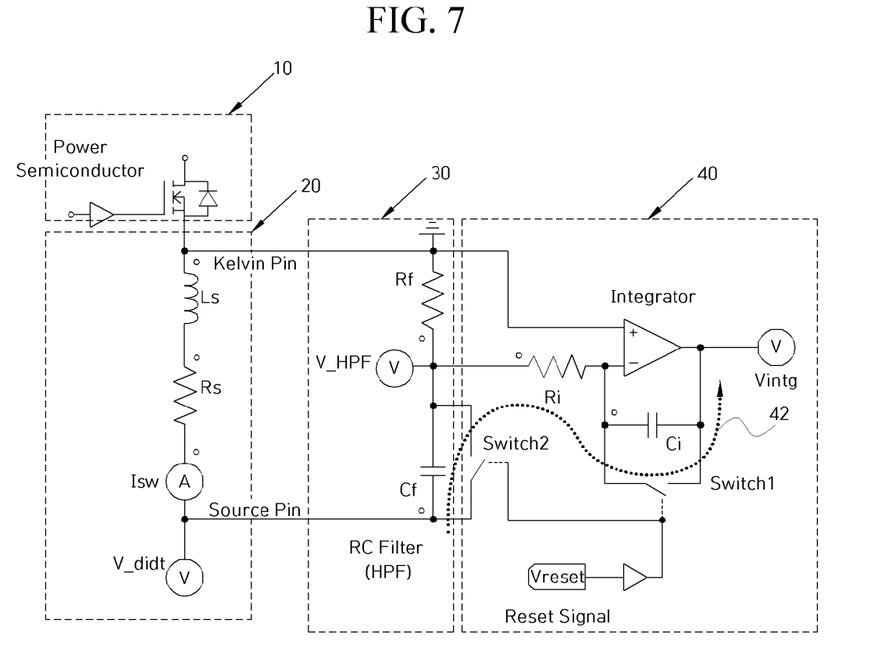
FIG. 7 illustrates another embodiment of the HPF, that is, the filter (30) shown in FIG. 4.
Figure 8A:
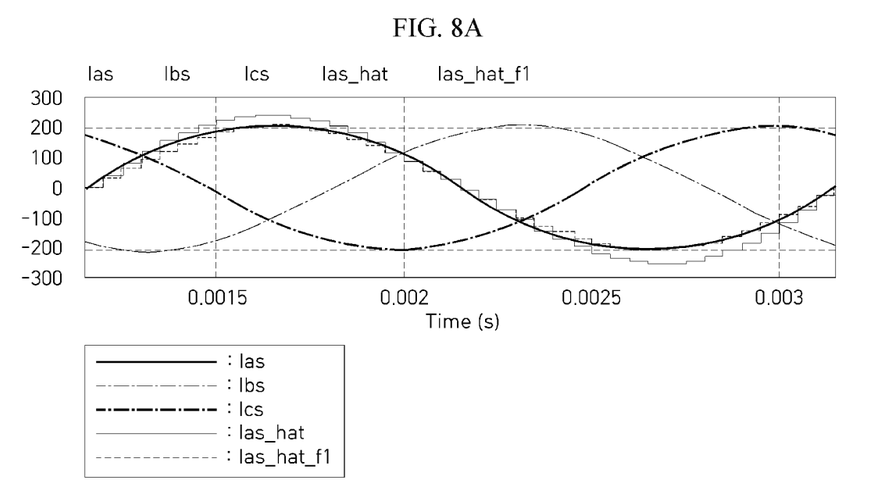
FIGS. 8A-8D show simulation result graphs showing a result of compensating for a stray resistance component according to the present invention.
Figure 8B:
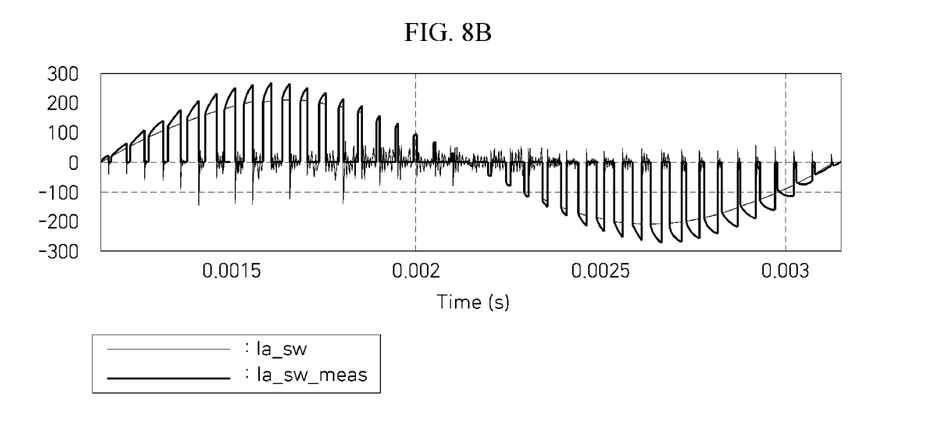
Figure 8C:
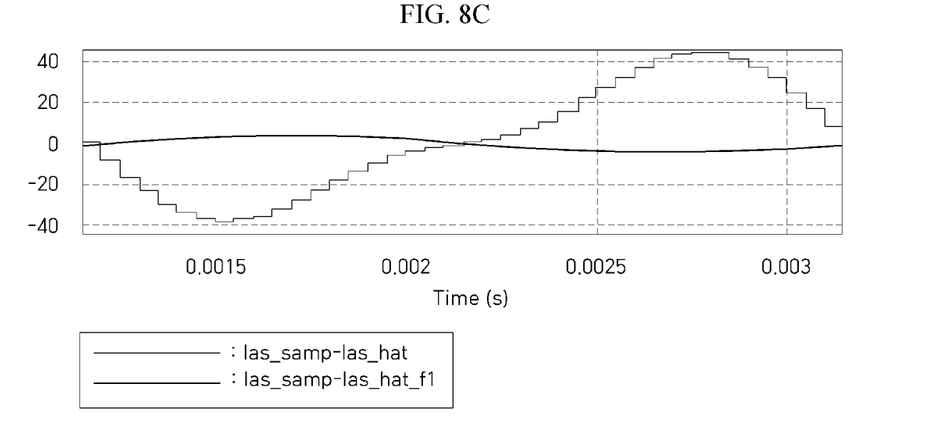
Figure 8D:
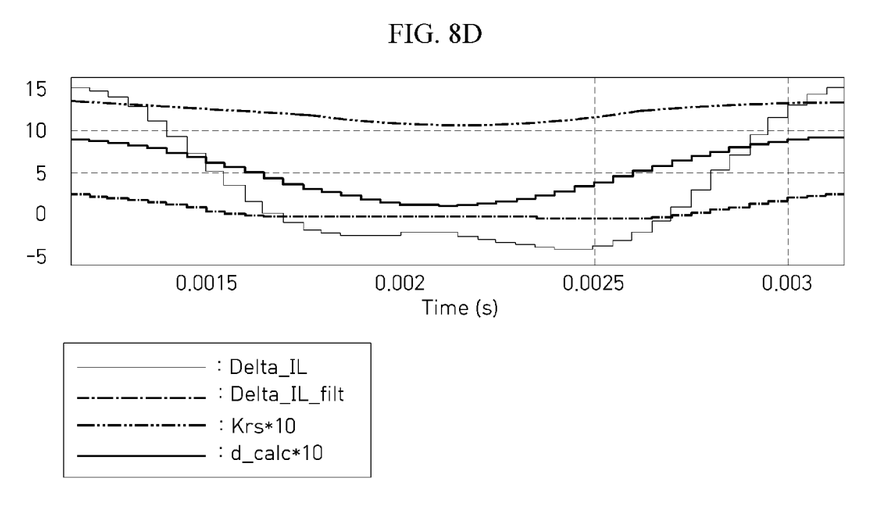

In addition, FIG. 7 illustrates another embodiment of the HPF, that is, the filter 30 shown in FIG. 4. While as a reset circuit there remains only the switch 1 connecting both ends of an integrating capacitor $C_i$, the switch 2 connecting both ends of a capacitor $C_f$ is omitted. During a PWM-OFF sequence, the integrating capacitor $C_i$ is reset using the switch 1, and during a PWM-OFF sequence, the capacitor $C_f$ of an HPF is reset through a path 42 for connecting the switch 2 and the capacitor $C_f$. Therefore, the separate switch 2 is not used.

Next, the compensator 70 will be described in detail.

The compensator 70 is implemented through a compensation algorithm using response characteristics of a three-phase inverter circuit (resistor-inductor (RL) circuit) and an RC filter. Since a power module has a temperature sensor (e.g., NTC), the compensator 70 may calculate a variation of a stray resistance value using the temperature sensor.

The compensator 70 provides a current value $i_{s\_hat}$ by removing a DCR component from a current value $i_{sw}$ (to be exact, $i_{sw\_samp}$ shown in FIG. 2) using Equation below. The current value $i_{s\_hat}$ is a measured value of a switching current from which a stray resistance component is removed. That is, $$i_{s-hat}(t) = \frac{I_{sw,meas}(t) - \Delta i_{sw}(t) - \Delta i_{sw\_filt}(t)}{k_{R_s}(t)} + \Delta i_{sw}(t) =$$

$$\frac{i_{sw,meas}(t)}{k_{R_s}(t)} + \left(1 - \frac{1}{k_{R_s}(t)}\right)\Delta i_{sw}(t) - \frac{\Delta i_{sw\_filt}(t)}{k_{R_s}(t)}$$

In Equation above, a current variation, which flows in an inverter RL circuit (i.e., stray inductance and stray resistance present between a Kelvin pin K and a source pin S of a power module), may be calculated as in Equation below.

$$\Delta i_{sw}(t) = \left(1 - e^{-\frac{R_m}{L_m}t}\right) \cdot \frac{(V_s^* - E_s)}{R_m} \cdot u(t) \cong \frac{t}{L_m}(V_s^* - E_s) \cdot u(t)$$

In addition, in Equation above, a filtered current variation of an Rs error (or variation) component and the inverter RL circuit may be calculated as in Equation below.

$$\Delta i_{sw\_filt}(t) = k_2(t) \cdot (V_s^* - E_s) \cdot u(t) =$$

$$\frac{\Delta R_s}{R_{s,25}} \cdot \frac{1}{R_m}\left(1 - \frac{L_m e^{-\frac{R_m}{L_m}t} - R_f C_f R_m e^{-\frac{1}{R_f C_f}t}}{(L_m - R_f C_f R_m)}\right) \cdot (V_s^* - E_s) \cdot u(t)$$

In addition, in Equation above, a parameter for compensating for the $R_s$ error (or variation) component may be calculated as in Equation below.

$$k_{R_s}(t) = 1 + f(R_f, C_f) = 1 + \frac{\Delta R_s}{R_{s,25}}\left(1 - e^{-\frac{t}{R_f C_f}}\right)$$

In Equations above, 0<t<D*Ts, wherein D refers to a duty cycle having a value between 0 and 1, $R_s$ and $L_s$ refer to stray resistance and stray inductance, $R_f$ and $C_f$ refer to RC filter parameters (of an HPF or an LPF), $R_m$ and $L_m$ refer to RL circuit parameters (for a three-phase inverter), $R_{s,25}$ refers to an original $R_s$ value at temperature 25° C., and $\Delta R_s$ refers to an error or variation of $R_s$.

FIGS. 8A-8D show simulation results showing a result of compensating for a stray resistance component according to the present invention. It shows a comparison between results before and after a compensational operation of the compensator 70.

Simulation conditions are as follows.

A stray resistance $R_s = 1.5 \times R_{s,25}$ (at power module temperature $T_c = 125°$ C.)

When a filter is applied, a sensing error is 22.5% (45 A)

When a filter and a compensation algorithm are applied, a sensing error is 2% (4 A)

The meanings of variables and parameters shown in FIG. 8 are as follows.

Ias, Ibs, and Ics: A-phase, B-phase, and C-phase currents [A]
Ias_hat: sampled switching current [A] of A-phase
Ias_hat_f1: compensated current [A]
Ia_sw: switching current [A] of A-phase
Ia_sw_meas: output of the integrator multiplied by $R_f \times C_f / L_s$ [A]
Ias_samp: sampled switching current [A] of A-phase
Delta_IL: current variation $\Delta i_{sw}(t)$
Delta_IL_filt: filtered current variation $\Delta i_{sw\_filt}(t)$
Krs: parameter for compensation
d_calc: duty ratio According to the present invention, it is possible to increase current measurement accuracy by minimizing the influence of dc resistance (DCR) that is changed as a temperature. It is possible to reduce costs required for a switching current measuring sensor. That is, a current transducer or a Hall effect sensor is used in the existing products, but according to the present invention, costs are reduced because a magnetic core required to constitute such sensors does not need to be used. In addition, since the magnetic core is not used, a size of an inverter product including a power module can be thereby effectively reduced.

Ultimately, accurate switching current can be measured by the present invention, thereby quickly and accurately detecting sensing an arm short circuit or an overcurrent phenomenon to protect a power semiconductor.

While configurations of the present invention have been described above with reference to the accompanying drawings, it is by way of example only. Those skilled in the art can make various modifications and changes within the technical spirit of the present invention. Therefore, the scope of the present invention should not be limited to the above-described embodiments but should be determined by the appended claims.

What is claimed is:

1. An apparatus, comprising:
   a current detector configured to detect a switching current of a power module flowing between a Kelvin pin and a source pin of the current detector and to output a voltage derived from a differential component of the switching current;
   a resistor-capacitor filter configured to filter the voltage output from the current detector;
   an integrator configured to integrate a voltage output from the filter;
   an analog-to-digital converter (ADC) configured to convert an analog voltage output from the integrator into a digital voltage and to sample the digital voltage;
   a scaler configured to apply a scaling constant to a sampled integrator output value output from the ADC and to output a sampled switching current; and
   a compensator configured to remove a temperature dependent direct current resistance (DCR) effect from the sampled switching current,
   wherein the filter is a high pass filter (HPF).

2. The apparatus of claim 1, wherein the integrator comprises an operational amplifier (OP AMP) and is configured to operate by receiving a pulse width modulation (PWM) switching signal from a controller.

3. The apparatus of claim 1, further comprising a reset circuit configured to perform resetting such that an integral value is not accumulated when the integrator performs an integration operation.

4. The apparatus of claim 3, wherein,
   during a PWM-ON sequence, the integrator is configured to perform the integration operation, and
   during a PWM-OFF sequence, the reset circuit is configured to perform a reset operation.

5. The apparatus of claim 3, wherein the reset circuit is configured to perform a reset operation through at least one switch opened and closed in response to a pulse width modulation (PWM) switching signal.

6. The apparatus of claim 1, wherein the compensator is configured to perform a compensation process on a current sampled by the ADC using a software algorithm to output a current from which a stray resistance component is removed.

7. The apparatus of claim 1, wherein the compensator comprises a software algorithm using parameters for compensating for a current variation flowing in stray inductance and stray resistance, a filtered current variation of a stray resistance (Rs) error component and an inverter resistor-inductor (RL) circuit, and the stray resistance (Rs) error component to remove the stray resistance component from the switching current.

8. A method, comprising:
   detecting a switching current of a power module flowing between a Kelvin pin and a source pin of the current detector and outputting a voltage derived from a differential component of the switching current;
   filtering the voltage output from the current detector with a resistor-capacitor filter;
   integrating the filtered voltage;
   converting an integrated analog voltage into a digital voltage to sample the digital voltage;
   applying a scaling constant to a sampled integrator output value and outputting a sampled switching current; and
   compensating for a current by removing a temperature dependent direct current resistance (DCR) effect from the sampled switching current,
   wherein the filtering is high-pass filtering.

9. The method of claim 8, wherein the integrating is performed using an operational amplifier (OP AMP), which is configured to operate by receiving a received pulse width modulation (PWM) switching signal.

10. The method of claim 8, further comprising performing resetting such that an integral value is not accumulated when an integration operation is performed.

11. The method of claim 10, wherein
during a PWM-ON sequence, the integration operation is performed, and
during a PWM-OFF sequence, the resetting is performed.

12. The method of claim 10, wherein, in the resetting, a reset operation is performed by at least one switch opened and closed in response to a pulse width modulation (PWM) switching signal.

13. The method of claim 8, wherein the compensating comprises performing a compensation process on a sampled current using a software algorithm to output a current from which a stray resistance component is removed.

14. The method of 8, wherein the compensating is performed by a software algorithm using parameters for compensating for a current variation flowing in stray inductance and stray resistance, a filtered current variation of a stray resistance (Rs) error component and a current variation of an inverter resistor-inductor (RL) circuit, and the stray resistance (Rs) error component to remove the stray resistance component from the switching current.

* * * * *